US011165127B2

(12) United States Patent
Vickes

(10) Patent No.: US 11,165,127 B2
(45) Date of Patent: Nov. 2, 2021

(54) T-SHAPED BROADBAND BANDPASS FILTER

(71) Applicant: SAAB AB, Linköping (SE)

(72) Inventor: Hans-Olof Vickes, Särö (SE)

(73) Assignee: SAAB AB, Linköping (SE)

( * ) Notice: Subject to any disclaimer, the term of this patent is extended or adjusted under 35 U.S.C. 154(b) by 181 days.

(21) Appl. No.: 16/336,801

(22) PCT Filed: Sep. 26, 2016

(86) PCT No.: PCT/SE2016/050910
§ 371 (c)(1),
(2) Date: Mar. 26, 2019

(87) PCT Pub. No.: WO2018/056879
PCT Pub. Date: Mar. 29, 2018

(65) Prior Publication Data
US 2019/0237837 A1 Aug. 1, 2019

(51) Int. Cl.
*G01R 29/08* (2006.01)
*H01P 1/20* (2006.01)
*H01P 1/203* (2006.01)

(52) U.S. Cl.
CPC .......... *H01P 1/20* (2013.01); *G01R 29/08* (2013.01); *H01P 1/20363* (2013.01)

(58) Field of Classification Search
CPC .......... G01R 29/08; H01P 1/20; H01P 1/2039
USPC .................. 324/76.19–76.68, 629, 637–639
See application file for complete search history.

(56) References Cited

U.S. PATENT DOCUMENTS

| 6,528,732 B1* | 3/2003 | Okubora ............... H01L 23/642 |
| | | 174/255 |
| 2004/0130446 A1* | 7/2004 | Chen ..................... G16H 40/67 |
| | | 340/539.12 |
| 2010/0207706 A1 | 8/2010 | Tamura et al. |
| 2015/0302231 A1 | 10/2015 | Makimoto et al. |

OTHER PUBLICATIONS

International Search Report with Written Opinion mailed in corresponding International Application No. PCT/SE2016/050910 dated May 29, 2017 (11 pages).

(Continued)

*Primary Examiner* — Melissa J Koval
*Assistant Examiner* — Courtney G McDonnough
(74) *Attorney, Agent, or Firm* — Sage Patent Group

(57) ABSTRACT

The filter unit has a center frequency and comprises a first dielectric substrate, a first conducting plane, and at least one transmission arrangement. The at least one transmission arrangement comprises a shunt node which has a shunt connection to the conducting plane. The electrical length of the shunt connection defines the center frequency of the filter unit. The transmission arrangement further comprises a plurality of transmission lines connected in series between an input port and an output port, wherein each port is connectable to auxiliary systems with a system impedance. Moreover, each transmission line has a characteristic impedance and wherein the characteristic impedance of each transmission line is less than the system impedance.

20 Claims, 9 Drawing Sheets

(56) References Cited

OTHER PUBLICATIONS

Ching-Luh Hsu et al.; "Microstrip Bandpass Filters for Ultra-Wideband (UWB) Wireless Communications" in: IEEE MTT-S International Microwave Symposium Digest, 2005; pp. 1-4 (4 pages).

Chun-Ping Chen et al.; "Synthesis of Optimum UWB Filters Composed of One-Wavelength Parallel-Coupled SIRs and Shunt Short-Circuited Stubs" in: IEICE Transactions on Electronics, vol. E96-C, Oct. 2013, No. 10; pp. 1281-1288 (8 pages).

George L. Matthaei et al.; "Microwave Filters, Impedance-Matching Networks, and Coupling Structures"; Artech House, Inc.; 1980; pp. 595-605 (7 pages).

Jia-Sheng Hong; "Microstrip Filters for RF/Microwave Applications"; Second Edition, 2011, pp. 155-157 (4 pages).

Takenori Yasuzumi et al.; "Ultra-Wideband Bandpass Filter with Sharp Attenuation Slope Using Inter-Digital Finger Resonator and Parallel-Coupled Lines" in: IEICE Transactions on Electronics, vol. E95-C, Feb. 2012, No. 2 pp. 268-274 (7 pages).

Zhang-Cheng Hao et al. "Ultra Wideband Bandpass Filter Using Embedded Stepped Impedance Resonators on Multilayer Liquid Crystal Polymer Substrate" in: IEEE Microwave and Wireless Components Letters, vol. 18, No. 9, Sep. 2008; pp. 581-583 (3 pages).

International Preliminary Report on Patentability mailed in corresponding International Application No. PCT/SE2016/050910 dated Nov. 29, 2018 (6 pages).

Extended European Search Report in corresponding European Application No. 16916911.7 dated Apr. 14, 2020 (10 pages).

Chi-Feng Chen et al.; "Compact dual-band stepped-impedance resonator filter with separate coupling paths"; Electronics Letters; Oct. 9, 2014; vol. 50, No. 21, pp. 1551-1552 (2 pages).

* cited by examiner

T-SHAPED BROADBAND BANDPASS FILTER

CROSS-REFERENCE TO RELATED APPLICATIONS

This application is a U.S. National Stage application of PCT/SE2016/050910, filed Sep. 26, 2016 and published on Mar. 29, 2018 as WO/2018/056879, all of which is hereby incorporated by reference in its entireties.

TECHNICAL FIELD

The invention pertains to the field of microwave filters. More particularly, the invention pertains to filter units, bandpass filters, and systems for detection which all comprise transmission lines.

BACKGROUND

Ultra-wideband, UWB, or broadband microwave filters are very essential components for modern communication systems applications, such as UWB wireless communication, broadband sensors, radar systems, and Airborne Electrically Steerable Antennas, AESAs. The growth in these fields has prompted rapidly the development of various types of broadband filters. Hence, broadband bandpass filter is a very important part of the UWB technology since the performance of broadband filters will directly affect the functions of the entire ultra-wideband systems.

Therefore, it is desirable to have bandpass filter with high performance and compact size.

SUMMARY

In the present disclosure a filter unit design comprising transmission lines, are presented. The filter unit and the associated bandpass filters and systems for detection have an improved bandpass performance and implementation possibilities.

According to aspects, a filter unit, with a center frequency, comprises a first dielectric substrate which has a first surface portion and a second surface portion. A first conducting plane is located on the first surface portion and at least one transmission arrangement is located on the second surface portion. Moreover, the at least one transmission arrangement comprises a shunt node which has a shunt connection to the conducting plane and wherein an electrical length of the shunt connection defines the center frequency of the filter unit. The at least one transmission arrangement further comprises a plurality of transmission lines connected in series between an input port and an output port, wherein each port is connectable to auxiliary systems with a system impedance. Furthermore, each transmission line has a characteristic impedance and the characteristic impedance of each transmission line is less than the system impedance.

Since the electrical length of the shunt connection defines the center frequency no tuning screws are required and it is easy to integrate the filter with other circuitry. The fact that the characteristic impedances are less than the system impedance makes it possible to achieve a very broadband filter. Moreover, the utilization of transmission lines gives a planar, non-bulky design with a small spatial extension. Hence, it is provided for flexibility in the design with regard to at least spatial compactness and the choice of center frequency. Furthermore, the filter can be designed without specialized and complicated computer software.

According to other aspects regarding the filter unit, the plurality of transmission lines is divided into a first segment and a second segment. The first segment is connected between the input port and the shunt node, and the second segment is connected between the output port and the shunt node. Moreover, each segment have a first transmission line and a second transmission line, and wherein the characteristic impedance of the first transmission line of the plurality of transmission lines is greater than the characteristic impedance of the second transmission line of the plurality of transmission lines.

According to the previous aspects, the first segment and the second segment each comprise at least four transmission lines connected in series.

By utilizing such design, a filter unit with a bandwidth approximately 160% is achieved, independently of the chosen center frequency. Moreover, it is provided for a filter with a flat bandpass region. Hence, the flexibility is vast in terms of design possibilities and applications.

Moreover, the usage of a symmetrical stepped impedance arrangement gives the designer many degrees of freedom. For example, by changing the number of stepped impedances in each side (each segment), the bandwidth of each filter unit may be altered. Furthermore, by changing the length of the individual lengths of the impedances, the center frequency of the filter unit may be altered.

Hence, the proposed solutions provide a simple and cost efficient way of implementing filter units.

Other aspects are related to a bandpass filter which comprises at least two filter units connected in series.

The cascade coupling provides for an adjustment of the inclination of the slopes at the lower and upper cut-off frequencies. Hence, further flexibility is given in the design process at least with regard to a planned area of use and quality requirements.

Accorded to aspects at least five filter units may be connected in series.

Such design provides for a filter with a flat bandpass region. Moreover, very sharp and well defined fall-offs at the cut-off frequencies are achieved. Hence, the filter singles out the preferred frequency parts of a signal in efficient manner.

In addition, and according to further aspects, the first segment and the second segment within each of the previous mentioned filter units comprise four transmission lines.

This enables the filter designer to achieve a high performance ultra-wideband filter with a bandwidth of about 160% independently of the center frequency. The achieved filter has also steep fall-offs at the cut-off frequencies, where the characteristics of the edges are altered by the number of cascade coupled filter units. The designer is given further degrees of freedom since he by changing the length of the individual lengths of the impedances may alter the center frequency of each filter unit. Hence, it is provided for a simple and cost-efficient way of implementing an ultra-wideband filter.

Other aspects are related to a system for detection. The system comprises detection circuitry, at least one bandpass filter, and at least one sensor comprising an antenna, wherein the at least one bandpass filter is configured in accordance with the description in the previous paragraphs.

Thus, there is provided herein for a system which can be utilized for detection. Thereby, the same advantages and benefits are obtained for the detection system as for the filter unit and bandpass filter as such.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIG. 7b is the frequency response, i.e., the signal transmission (solid), and the input port match (dashed) of the filter unit in FIG. 7a.

DETAILED DESCRIPTION

Figure 1:
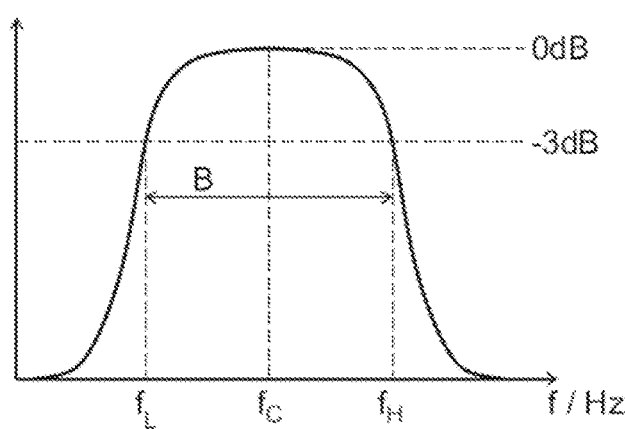
FIG. 1 shows a frequency response of a bandpass filter. The y-axis corresponds to the power of the output signal in dB.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the disclosure. As used herein, the singular forms "a", "an" and "the" are intended to include the plural forms as well, unless the context clearly indicates otherwise.

The disclosed device proposes a filter unit and a bandpass filter with ultra-wideband properties and fall-offs with steep slopes at the lower and upper cut-off frequencies. This is achieved by a T-shaped planar filter design comprising transmission lines in a stepped impedance arrangement with a central ground connection.

To facilitate the understanding of the proposed filter, different aspects in relation to ultra-wideband filters is further elaborated.

Ultra-wideband (also known as UWB, ultra-wide band and ultraband) is a radio technology that can use a very low energy level for short-range and high-bandwidth communications over a large portion of the radio spectrum. In order to achieve high performing communication, filters admitting signals with frequencies in the desired frequency span are acquired.

FIG. 1 illustrates an exemplary frequency response, i.e. the output signal power in dB as a function of the frequency, of a bandpass filter with bandwidth B. The parts of the signal with frequencies between fL and fH pass whereas the others are rejected. Usually, fL and fH are the lower and upper cutoff frequencies where the output signal power is down by −3 dB. Moreover, the center frequency, fC, is the arithmetic of the lower cutoff frequency and the upper cutoff frequency, or if expressed in percent; 100(fH−fL)/fC. To achieve high performance it is desirable to have a flat passband and to have steep slopes (fall-offs or cutoffs) at the cutoff frequencies.

Figure 2:
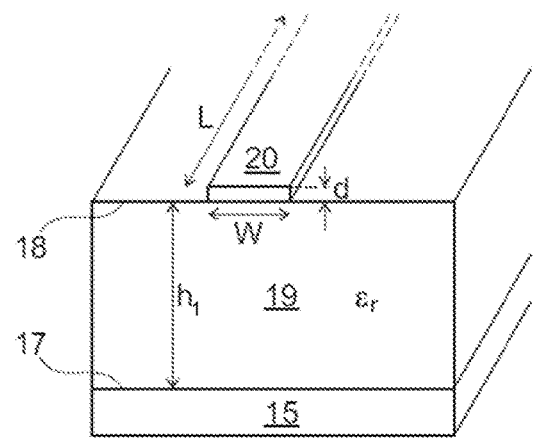
FIG. 2 illustrates the geometry of a microstrip transmission line.

One way to achieve a filter function is to utilize microstrip lines. FIG. 2, illustrates a schematic view of a microstrip geometry. The microstrip comprises a transmission line, i.e., a conductor 20, with a width, W, a height, d, and a length, L. The conductor 20 is printed on the top surface (a first surface portion) 18 of a thin, dielectric substrate, 19, with a height h1, and a relative permittivity, εr. The bottom surface (a second surface portion) 17 of the dielectric substrate 19 is in connection with a plane 15 with a reference potential, e.g. the dielectric substrate is grounded.

Figure 3:
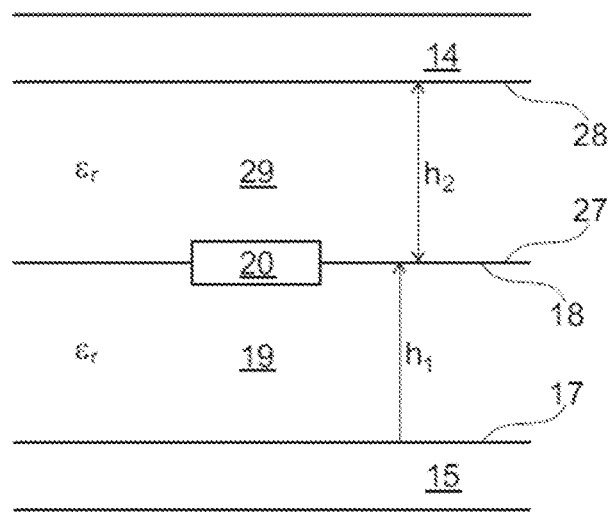
FIG. 3 illustrates the geometry of a stripline transmission line.

Yet another way of achieving a filter function is to utilize a stripline set-up. FIG. 3, illustrates the geometry. Compared to the microstrip set-up, the conductor 20 (transmission line) is embedded in the dielectric material. Hence, in addition to the features described with reference to FIG. 2, a first surface portion (the bottom) of a second dielectric substrate 29 with height h2 is positioned on the second surface portion (the top) of the dielectric substrate 19 and the conductor 20. The second dielectric substrate 29 has the same relative permittivity, εr, as the first one. On top of the second dielectric substrate 29 is a plane 14 with a reference potential, e.g. the second dielectric substrate is grounded. The stripline provides a homogeneous medium for electromagnetic waves compared to the uncovered microstrip line structure.

There are several ways to achieve a filter function by utilizing microstrip lines or stripline structures. For example, stepped-impedance low-pass filters where sections of very high and very low characteristic impedance lines are altered. One challenge is that this technique makes it hard to achieve sharp cut-offs. Another example is to use coupled line filters, i.e., the coupling between parallel placed striplines or microstrip lines are utilized to achieve narrowband filters, one example is given in US 2005/0140472 A1, where the microstrip lines are end-coupled by gaps. In [Mondal, Pratik, Arabinda Roy, and S. K. Parui. "Design of a bandpass filter using multimode resonators for ultra-wideband application." Computers and Devices for Communication (CODEC), 2012 5th International Conference on. IEEE, 2012] bandwidths of 100% are achieved by utilizing multimode stepped-impedance resonators, SIR, i.e., transmission-line resonators whose both ends are open circuited, coupled in a back-to-back manner.

Figure 4:
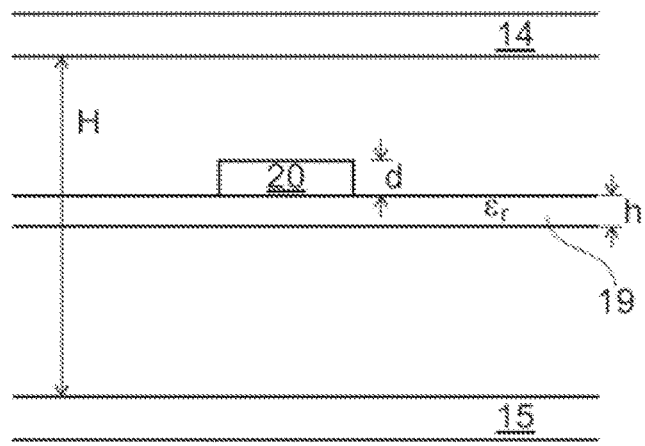
FIG. 4 illustrates the geometry of a suspended stripline transmission line.

Another alternative to create filter with high bandwidth is by using the concept of suspended stripline, as illustrated in FIG. 4. This design is bulky, usually requiring tuning screws, and is expensive and hard to integrate with other circuitry. Also, the suspended stripline concept requires impedance ratios of typically 35:1 when used for filter designs.

The proposed ultra-wide band filters provide for an alternative compact and planar design in order to achieve bandwidths in the order of 160%. The filter unit comprises cascade coupled transmission lines connected in a T-shaped manner. Moreover, each filter unit is grounded via a shunt connection wherein the length of the shunt connection determines the center frequency of the filter unit. Hence, no tuning screws are necessary. Furthermore, the bandwidth of the filter is independent of the center frequency (expressed in percent) and is regulated by the number of transmission lines comprised in each filter unit. The steepness of the slopes at the cut-off frequencies are altered by the number of filter unit connected in series.

The proposed methods will now be described in more detail referring to FIGS. 5-11. The figures comprise some features which are illustrated with solid lines and features which are illustrated with dashed lines. The features which are illustrated with solid lines are operations which are comprised in the broadest example embodiment. The features which are illustrated with dashed lines are example embodiments which may be comprised in, or a part of, or are further embodiments which may be taken in addition to the features of the broader example embodiments.

Figure 5A:
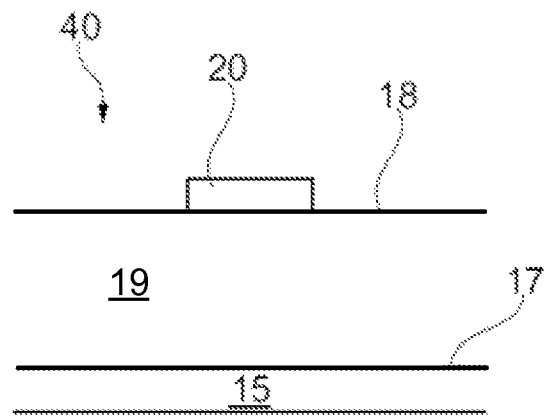
FIG. 5a-b shows different views of an exemplary filter unit of the present disclosure.
Figure 5B:
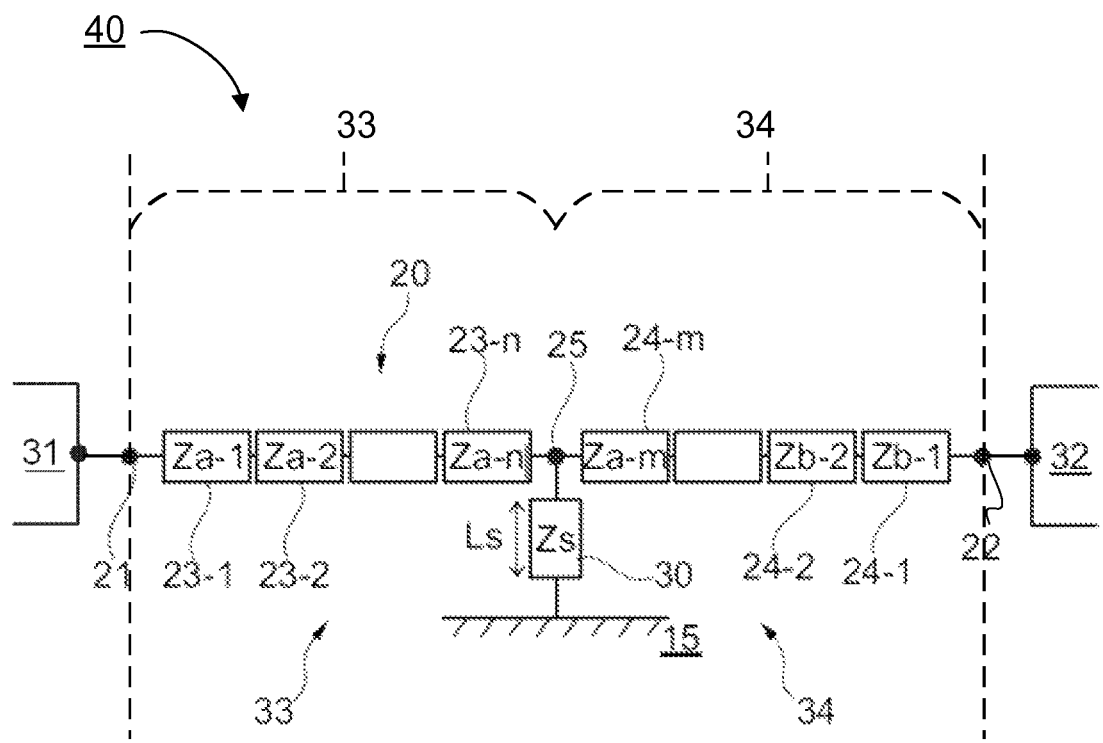

FIGS. 5a and 5b illustrate a filter unit 40 with a center frequency. In other word, it is an electronic circuit with filter properties. The center frequency, i.e., fC, is previously described in relation to FIG. 1.

The filter unit 40 comprises a first dielectric substrate 19 having a first surface portion 17 and a second surface portion 18, a first conducting plane 15 located on the first surface portion 17 and at least one transmission arrangement 20 located on the second surface portion 18. Hence, the transmission arrangement comprises conductive material, e.g. transmission lines, which provide conditions for an electromagnetic signal to propagate. For example, the design may be that of a microstrip design where metal strips are placed on a dielectric substrate material adjacent to a conduction ground plane as previously described in relation to FIG. 2.

The conducting plane 15 is a plane with a reference potential. It could in some examples be a grounded plane with a zero potential. However, the potential reference level may be separated from zero in other examples.

The utilization of transmission lines gives a planar, non-bulky, non-expensive design with a small spatial extension. Hence, it is provided for flexibility in the design with regard to at least spatial compactness. The filter unit 40 can hereby also be manufactured at a low cost.

The at least one transmission arrangement 20 comprises a shunt node 25 which has a shunt connection 30 to the conducting plane 15. In other words, the shunt is connected to the conducting plane 15. If the conducting plane has a potential of zero then the shunt 30 is said to be grounded.

A shunt 30 is a device which allows electric current to pass to another point in a circuit by creating a low resistance path. Moreover, an electrical length of the shunt connection 30 defines the center frequency of the filter unit 40. The proposed filter unit design can be utilized to produce filters with any center frequency. However, this property of the filter, i.e. fC, is fixed by the electrical length of the shunt. This means that the center frequency is very precisely defined. Moreover, no tuning screws are necessary in order to set the center frequency. It is also easy to integrate the filter unit with other circuitry.

The electrical length or the phase length of a transmission line is defined in radians as $2\pi L/\lambda$, where L is the physical length of the transmission line and $\lambda$ is the wavelength of the propagating signal. Thus, the electrical length depends on the frequency. The electromagnetic properties of a transmission line repeat itself for each factor of $p2\pi$ that is added to the electrical length (p is an integer greater than zero). Hence, a transmission line with an electrical length of $\pi/4$ has the same electromagnetic properties as one with an electrical length of $5\pi/4$ or $9\pi/4$. In this context it is also appropriate to talk about an equivalent electrical length. If the electrical length is greater than $2\pi$ then the equivalent electrical length is the corresponding electrical length in the interval $[0,2\pi]$ that gives rise to the same electromagnetic properties as the original electrical length. For example, transmission lines with electrical lengths of $\pi/4$, $5\pi/4$ and $9\pi/4$, respectively, all have the same equivalent electrical length, i.e., $\pi/4$.

According to further aspects of the filter unit and the shunt, the shunt has a length LS and the center frequency of the filter unit 40 is related to a wavelength $\lambda C$ of the filter unit 40. That is, the shunt has a spatial extension of LS in the propagation direction of the signal. Moreover, the frequency fC of a signal and the corresponding wavelength $\lambda C$ is related by the phase velocity vpC at the center frequency, i.e., $\lambda C=vpC/fC$.

Furthermore, according to aspects, the electrical length of the shunt connection 30 is $2\pi LS/\lambda C=\pi/2+p2\pi$, wherein p is an integer greater or equal to zero. That is, the equivalent electrical length of the shunt is set to 90 degrees or alternatively expressed; the phase length of the shunt is 90 degrees with an added multiple of $2\pi$ when the frequency of the signal is fC. Moreover, an electrical length of $\pi/2$ corresponds to a physical length of the shunt of $LS=\lambda C/4$. For instance a length LS=2.5 mm corresponds to a centre frequency of approximately 10 GHz and a length LS=8 mm corresponds to a centre frequency of approximately 3 GHz.

Specifically, the shunt connection 30 disclosed is a short-circuited transmission line. This means that one end is connected to a conducting plane 15 with a reference potential, e.g. a grounded plane. According to transmission line theory, when starting from a short circuit, here the grounded plane 15, the other end of the shunt (where the shunt node 25 is located) acts as an open circuit, if the electrical length of the shunt is set to $\pi/2$ of the center frequency fC. This means that no signals with the frequency fC can pass through the shunt. Hence, the signal with frequency fC is not affected by the shunt 30, it propagates through the filter unit. On the other hand, if the frequency of the signal is 2fC, then the electrical length of the shunt corresponds to n and the shunt acts as a short circuit in the end not connected to ground. Hence, the signal with the frequency 2fC is transmitted through the shunt and is thereby filtered out.

The at least one transmission arrangement 20 of the filter unit 40 illustrated in FIGS. 5a and 5b further comprises a plurality of transmission lines 23-1, . . . , 23-n, 24-1, . . . , 24-m connected in series (cascade coupled) between an input port 21 and an output port 22, each port connectable to auxiliary systems 31, 32 with a system impedance.

A transmission line is a structure designed to carry alternating current of radio frequency, that is, currents with a frequency high enough that their wave nature must be taken into account. According to one aspect, it can be metal strips in a microstrip design. The filter unit has an input port 21 and an output port 22 which are utilized to insert the filter unit into an electric circuit, i.e. the input port and the output port are connectable to the auxiliary systems. The system impedance is the input impedance seen by the input port 21 or the output port 22 when connected to the auxiliary systems. In order to avoid reflections, impedance matching might be preferred. According to some aspects, the system impedances of the auxiliary systems connected to the input port and the output port, respectively, might be different. In another alternative the system impedance is 50 Ohm.

The number of transmission lines may vary ("m" and "n" in the figures are integers greater than zero). Hence, in one example situation m equals n and in another exemplary situation m differs from n.

One reason to have m≠n is when the physical design of the filter unit requires a physical extension of the filter in order to be able to reach a port of an auxiliary system. An exemplary scenario of this is given when m=3 and n=2. The filter unit then comprises five transmission lines but only four of them 23-1, 23-2, 24-3, 24-2 contributes to the filter functions. The fifth transmission line 24-1 is connected to the output port 22 and has the same characteristic impedance as the system impedance. Hence, it acts as a connector between the filter unit and the auxiliary system.

In one exemplary design, n=m=1. Further, if the characteristic impedances of both transmission lines 23-1, 24-1 are approximately equal and the shunt node is positioned in between them then a narrow banded filter unit is achieved.

Moreover, each transmission line 23-1, . . . , 23-n, 24-1, . . . , 24-m, figuratively illustrated in FIGS. 5a and 5b, has a characteristic impedance Za-1, . . . , Za-n, Zb1, . . . , Zb-m and the characteristic impedance Za-1, . . . , Za-n, Zb1, . . . , Zb-m of each transmission line 23-1, . . . , 23-n, 24-1, . . . , 24-m is less than the system impedance.

The characteristic impedance of a uniform transmission line is the ratio of the amplitudes of voltage and current of a single wave propagating along the line; that is, a wave travelling in one direction in the absence of reflections in the other direction. Characteristic impedance is determined by the geometry and materials of the transmission line.

In the proposed design the ratio between the characteristic impedances of each transmission line and the system impedance is always less than one. This arrangement supports small signal loss even at millimeter wave range.

According to further aspects a ratio between the characteristic impedance Za-1 of the transmission line 23-1 connected to the first port 21 and the system impedance is more than 0.8 and/or wherein a ratio between the characteristic impedance Zb-1 of the transmission line 24-1 connected to the second port 22 and the system impedance is more than 0.8.

Hence, a lower bound is given for the ratio between the characteristic impedances of the transmission lines directly connected to the auxiliary systems, i.e. the outermost transmission lines of the filter unit.

In one exemplary design where the system impedance is 50 Ohm, each impedance of the transmission lines connected to the input port and the output port is in the range [44-46] Ohm.

A relation between the characteristic impedance of the shunt 30 and the system impedance is also suggested. Hence, in some exemplary designs, the shunt connection 30 has a characteristic impedance Zs. Particularly, a ratio between the characteristic impedance Zs of the shunt connection 30 and the system impedance is in the interval [0.8-1.2], and preferable in the interval [0.9-1.1]. This implies that the characteristic impedance of the shunt is of the same order as the characteristic impedance of the system but it is allowed for some deviation. For example, if the system impedance is 50 Ohm then the shunt connection is to be chosen in the interval [40-60] Ohm or preferable in the interval [45-55] Ohm. The characteristic impedance of the shunt can be both higher and lower than the system impedance. Furthermore, the characteristic impedance of the shunt can according to some aspects be lower than at least one of the characteristic impedances of the transmission lines.

According to further aspects, a relation between the electrical length of each of the transmission lines and the electrical length of the shunt is proposed. Hence, each transmission line has an electrical length and the electrical length of the transmission lines and the electrical length of the shunt connection 30 corresponds to an equivalent electrical length in the interval $[0, 2\pi]$ (as previously discussed). Moreover, a ratio between the equivalent electrical length of each transmission line and the equivalent electrical length of the shunt connection 30 is in the interval [0.9-1.1] at the center frequency of the filter unit 40.

As previously discussed, the equivalent electrical length of the shunt is set to 90 degrees at the center frequency. Hence, the length of the shunt defines the center frequency of the filter unit. The equivalent electrical lengths of the transmission lines are approximately the same as the equivalent electrical length of the shunt. However, their equivalent electrical lengths are allowed to vary within the interval $[0.9-1.1]\pi/2$. Moreover, the bandwidth (in percent) of the filter unit is independent of the center frequency.

In one exemplary situation the ratio between each equivalent electrical length of the transmission lines and the equivalent electrical length of the shunt is in the interval [0.99-1.01]. Hence, the equivalent electrical lengths of each transmission line are allowed to vary within the interval $[0.9-1.1]\pi/2$.

In another exemplary design the plurality of transmission lines 23-1, . . . , 23-n, 24-1, . . . , 24-m is divided into a first segment 33 and a second segment 34. The first segment 33 is connected between the input port 21 and the shunt node 25, and the second segment 34 is connected between the output port 22 and the shunt node 25. Simply speaking, the first segment refers to all transmission lines the signal propagates through before it reaches the shunt node and the second segment refers to all transmission lines the signal propagates through after it has passed the shunt node (not taking reflections into account). Moreover, each segment have a first transmission line 23-1,24-1 and a second transmission line 23-2, 24-2, and the characteristic impedance Za-1, Zb-1 of the first transmission line 23-1, 24-1 of the plurality of transmission lines 23-1, . . . , 23-n, 24-1, . . . , 24-m is greater than the characteristic impedance Za-2, Zb-2 of the second transmission line 23-2,24-2 of the plurality of transmission lines 23-1, . . . , 23-n, 24-1, . . . , 24-m.

In other words, there are at least two transmission lines 23-1, 23-2 between the input port 21 and the shunt node 25. In the same way are there at least two transmission lines 24-1, 24-2 between the output port 22 and the shunt node 25. Moreover, the characteristic impedances of the transmission lines are either descending or rising when moving from the ports 21, 22 towards the shunt node 25.

The number of impedances in each segment will determine the bandwidth of the bandpass unit 40. A more narrow bandpass filter will be obtained if fewer impedances are used and an even broader bandpass filter will be achieve if more impedances are used.

According to even further aspects with regard to the previous exemplary design, the second transmission line 23-2, 24-2 is arranged closer to the shunt node 25 than the first transmission line 23-1, 24-1. In other words, the outermost transmission lines have the highest characteristic impedances, the second outermost transmission lines have the second highest characteristic impedances etc., i.e. Za-1>Za-2> ... >Za-m and Zb-1>Zb-2> ... >Zb-n. The shunt connection is positioned between the segments 33, 34.

Hence, according to aspects the at least one transmission arrangement 20 is a stepped impedance arrangement and when taking the shunt into account it all together forms a T-shaped stepped impedance pattern.

Considering the previously discussed value intervals of the characteristic impedances, several exemplary designs are available. According to some aspects, the characteristic impedance of the shunt is greater than the characteristic impedances of the first transmission lines 23-1, 24-1 connected to the auxiliary systems.

According to other aspects, the characteristic impedance of the shunt is smaller than the than the characteristic impedances of the first transmission lines connected to the auxiliary systems Za-1, Zb-1, but greater than the second characteristic impedances of the transmission lines Za-2, Zb-2 connected to the outermost transmission lines Za-1, Zb-1.

The given examples are not exhaustive.

In another exemplary design the at least one transmission arrangement 20 is symmetrical about the shunt node 25 with regard to at least the characteristic impedances Za-1, ..., Za-n, Zb1, ..., Zb-m of the plurality of transmission lines 23-1, ..., 23-n, 24-1, ..., 24-m. Hence, in its broadest sense this means that the sum of all characteristic impedances of the left segment is equal to the sum of all characteristic impedances of the right segment.

However, according to further aspects the first segment 33 and the second segment 34 comprise equal amounts of transmission lines 23-1, ..., 23-n, 24-1, ..., 24-m connected in series. Hence, the designed is mirrored with respect to the shunt node 25 and Za-1 is approximately equal to Zb-1, Za-2 is approximately equal to Zb-2, Za-n is approximately equal to Za-m, and m=n.

The "approximately equal" also expressed as "=" means that the segments 33, 34 of the filter unit does not have to be absolutely equal, just equal enough to achieve the filter functionality of a symmetrical filter. It also means that the value is within a reasonable tolerance level known within the technical field.

There are several advantages of using a symmetrical stepped impedance arrangement with ground connection at center of the stepped impedance arrangement. For example, by changing the number of stepped impedances in each side (in each segment), the bandwidth of each filter unit may be altered. Few transmission lines provide for a more narrowband filter than the utilization of several transmission lines in each segment. Moreover, by changing the length of the shunt and thereby the individual lengths of the transmission lines, the center frequency of each filter unit may be altered. Hence, the proposed filter unit provides a simple and cost efficient way of implementing ultra-wideband filters.

According to even further aspects the impedance ratio of the filter unit 40 may be 3:1, wherein the impedance ratio is defined as Za-1:Za-n, where in this case Za-1=Zb-1, Za-m=Zb-n and m=n. This is to be compared to impedance ratios of 35:1 in ultra-wide band filter designs comprising suspended striplines.

As previously mentioned the characteristic impedance is determined by at least the geometry of the microstrip lines and the materials utilized in the design. Hence, all the features connected to the characteristic impedance discussed in relation to FIGS. 5a and 5b can of course also be discussed in relation to the geometry of the transmission lines. In other words, the characteristics impedance Zs of the shunt connection 30 and the characteristic impedances Za-1, ..., Za-n, Zb1, ..., Zb-m of the plurality of transmission lines 23-1, ..., 23-n, 24-1, ..., 24-m are based on at least a cross sectional area As of the shunt connection 30 and a cross sectional area Aa-1, ..., Aa-n, Ab-1, ..., Ab-m of the plurality of transmission lines 23-1, ..., 23-n, 24-1, ..., 24-m, respectively. The length and width for the shunt connection will define the characteristic impedance of the shunt and thereby the center frequency of the filter unit.

Figure 6:
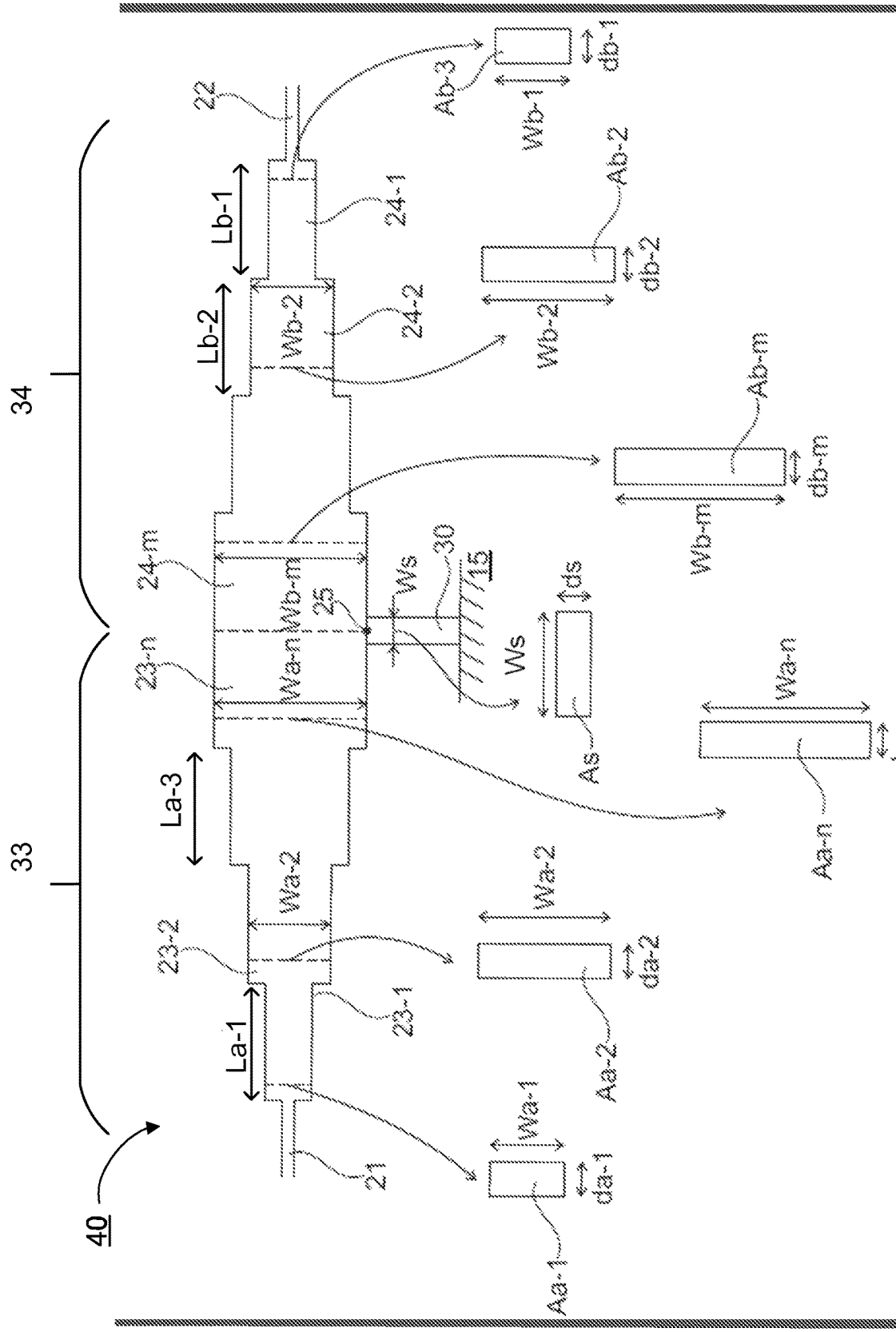
FIG. 6 shows another exemplary filter unit of the present disclosure.

The geometry of the transmission lines and the shunt connection is elaborated on in reference to FIG. 6 wherein an exemplary design is illustrated. Each transmission line and the shunt connection is realized as a microstrip pattern having physical lengths La-1, ..., La-n, Lb-1, ..., Lb-m, Ls, widths Wa-1, ..., Wa-n, Wb-1, ..., Wb-m, Ws, thicknesses da-1, ..., da-n, db-1, ..., db-m, ds, or alternatively expressed cross sectional areas Aa-1, ..., Aa-n, Ab-1, ..., Ab-m, As.

The characteristic impedance is inversely related to the cross sectional area. In an example where the thicknesses of all the transmission lines and the shunt are the same the characteristic impedance is inversely related to the width of the transmission lines and the shunt and the stepped impedance arrangement is clearly visualized.

According to an exemplary design, the change of the characteristic impedance along the first and the second segments 33, 34 does not have to be in defined steps. Thus the characteristic impedance may be allowed to change (linear or non-linear) along the length of the transmission lines. In other words, the characteristic impedances Za-1, ..., Za-n, Zb1, ..., Zb-m (as described in FIG. 5b) of the plurality of transmission lines 23-1, ..., 23-n, 24-1, ..., 24-m are based on at least a cross sectional area Aa-1, ..., Aa-n, Ab-1, ..., Ab-m of the corresponding transmission line. Moreover, the cross sectional area varies along a length La-1, ..., La-n, Lb-1, ..., Lb-m of the transmission line such that a cross sectional area close to the shunt node 25 is larger than a cross sectional area further away from the shunt node 25.

One way of implementing this change of the characteristic impedance along the length of the transmission lines may be by utilizing a tapered design.

Yet another alternative is to have a continuous change of the characteristic impedance along the segments. Or differently expressed, a cross sectional area Aa-1, Ab-1 of the first transmission line 23-1, 24-1 and a cross sectional area Aa-2, Ab-2 of the second transmission line 23-2, 24-2 are the same at the connection between the first transmission line 23-1, 24-1 and the second transmission line 23-2, 24-2.

Figure 7A:
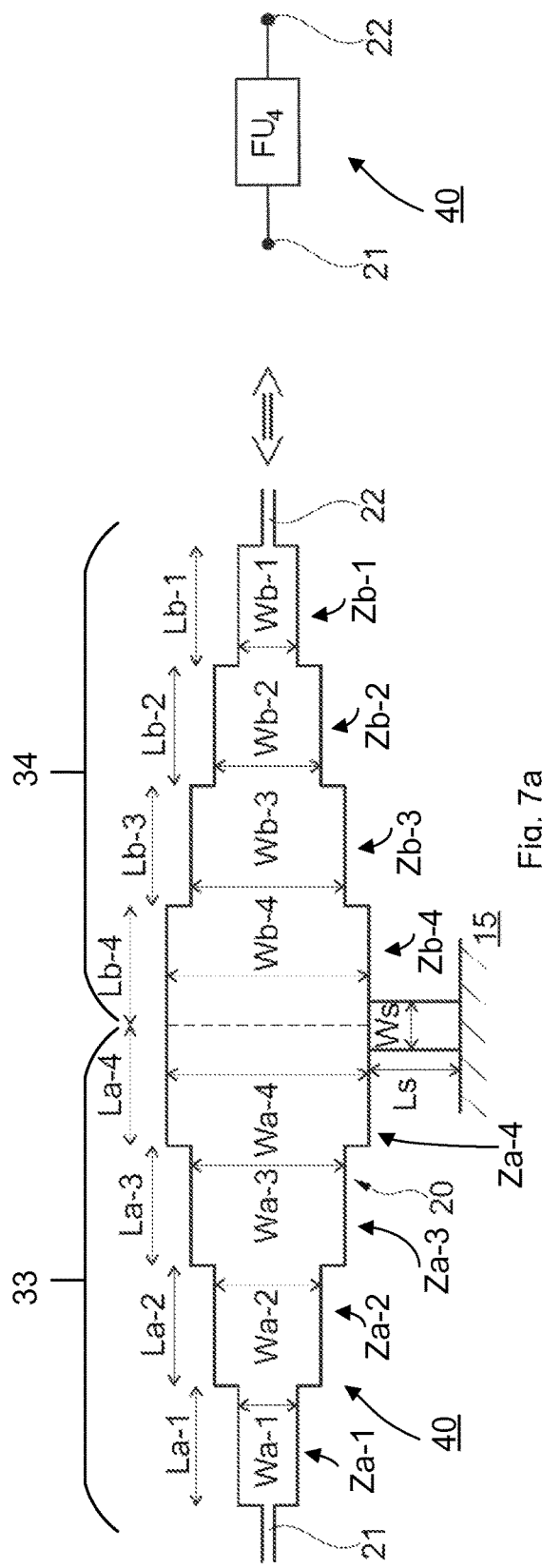
FIG. 7a shows another exemplary filter unit of the present disclosure. The filter unit comprises eight transmission lines.
Figure 7A:
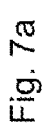

In FIG. 7a is a specific variant of the general filter unit in FIG. 5 figuratively illustrated. The first segment 33 and the second segment 34 of the filter unit each comprise at least four transmission lines connected in series.

Hence, the horizontal part of the filter unit 40, FU4 consists of a stepped impedance arrangement which is mirrored (both with respect to characteristic impedance and to geometry) at the shunt connection. Each one of the eight transmission lines and the shunt is realized as a microstrip pattern having a specific characteristic impedance, length and width. The horizontal part of the filter unit consists of stepped impedances, wherein the characteristic impedances of the transmission lines connected to the ports 21, 22 are the largest. The characteristic impedances then drop of in the direction towards the center of the arrangement, i.e. towards the shunt node. That is, the filter unit is a T-shaped, symmetrical, transmission arrangement with a shunt connection at the center, i.e., at the shunt node. The equivalent electrical length of the shunt node is set to be 90 degrees at center frequency.

A simulation of the filer unit described in FIG. 7a is performed, wherein
Wa-1=Wb-1=0.28 mm, La-1=Lb-1=2.80 mm, Za-1≈Zb-1≈48Ω,
Wa-2=Wb-2=0.367 mm, La-2=Lb-2=2.78 mm, Za-2≈Zb-2≈41.5Ω,
Wa-3=Wb-3=0.558 mm, La-3=Lb-3=2.70 mm, Za-3≈Zb-3≈32.5Ω,
Wa-4=Wb-4=0.905 mm, La-4=Lb-4=2.50 mm, Za-4≈Zb-4≈23.5Ω,
Ws=0.262 mm, Ls=2.76 mm, Zs≈50Ω,
and the system impedance is ≈50Ω, wherein "≈" is approximately equal as previously discussed. Moreover, the dielectric substrate 19 is Aluminate (AlO2), with a dielectric constant of 9.6. The height of the dielectric substrate (h1 in FIG. 2) is 0.254 mm. The thickness of each of the microstrip lines and the shunt are 5 micrometer and the material is Gold (Au).

Figure 7B:
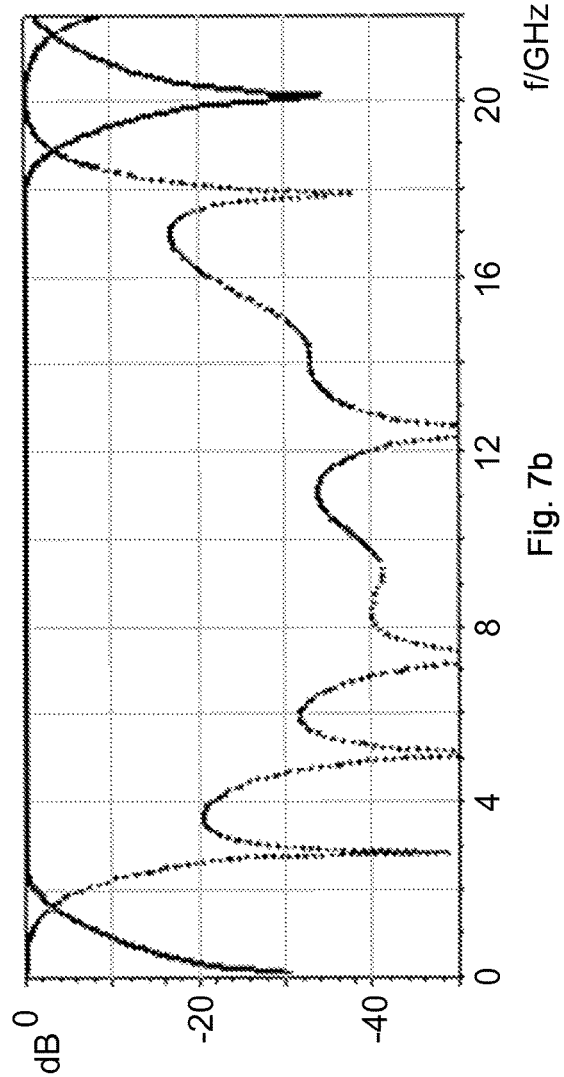

This gives a center frequency of about 10 GHz and an impedance ratio of 2:1. FIG. 7b shows an electromagnetic simulation of the S-parameters (dB) of a filter link design as illustrated in FIG. 7a. The solid line represents the signal transmission (S21) and the dashed line the input port match (S11), respectively. The x-axis represents the frequency (GHz). Note the transmission notch at 20 GHz, where the higher cut-off frequency is located. The definition of S-parameters is obvious for a skilled person in the art.

Hence, it is provided for a planar design which requires no tuning screws. The design is simple to realize and easy to integrate with other circuitry. Moreover, it is provided for a filter with a flat bandpass region. Hence, the flexibility is vast in terms of design possibilities and applications.

The circuit topology allows the designer to alter the number of transmission lines in each segment. More transformers, larger bandwidth. Fewer transformers, less bandwidth. In other words, the number of transmission lines sets the bandwidth.

Figure 8:
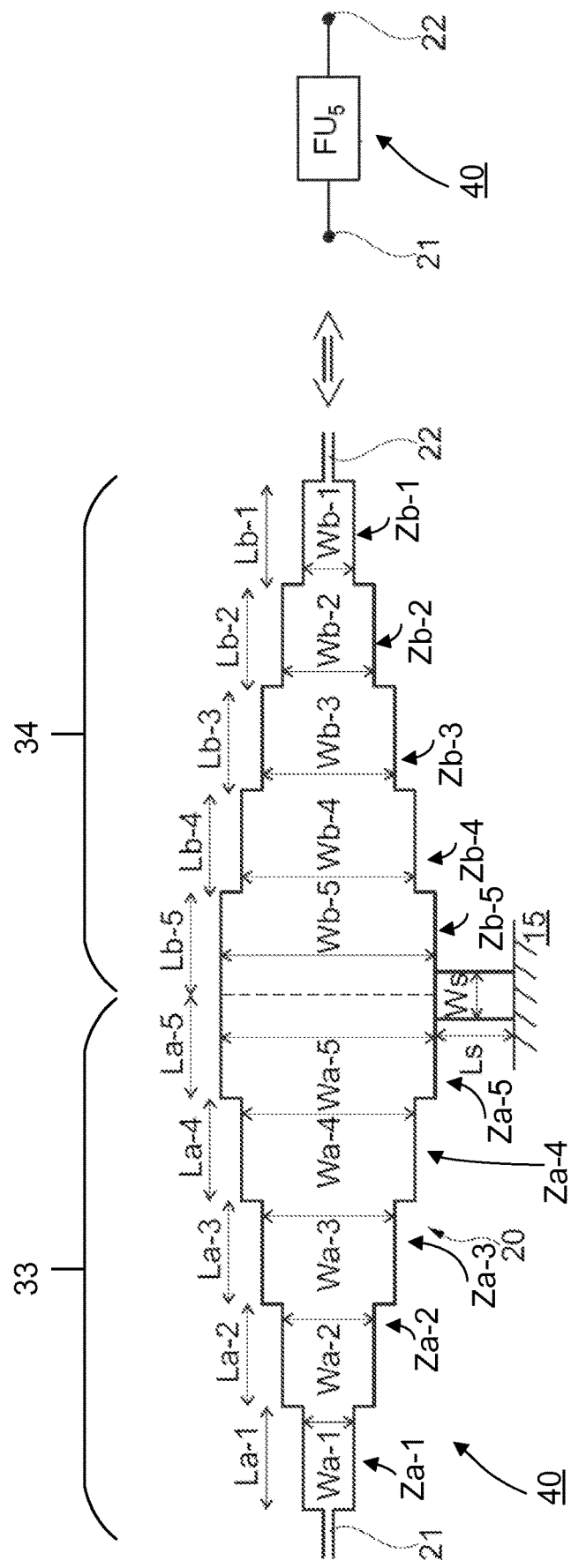
FIG. 8 shows another exemplary filter unit of the present disclosure. The filter unit comprises ten transmission lines.

In FIG. 8 is another specific variant of the general filter unit in FIG. 5 figuratively illustrated. This filter unit 40, FU5 comprises ten transmission lines. Or in other words, the first segment 33 and the second segment 34 each comprise at least five transmission lines connected in series.

This embodiment of the filter unit comprises the same advantages as previously described with regard to the ones in FIGS. 5-6. However, an even wider bandwidth is achieved than is shown in FIG. 7b since there are more transmissions lines in each segment in this embodiment. Hence, it is provided for a circuit topology satisfying the need of filters with extreme bandwidths.

According to some aspects of the previously described embodiment in FIG. 8, the values might be chosen as:
Wa-1=Wb-1=0.28 mm, La-1=Lb-1=2.540 mm, Za-1≈Zb-1≈48Ω
Wa-2=Wb-2=0.344 mm, La-2=Lb-2=2.55 mm, Za-2≈Zb-2≈43Ω
Wa-3=Wb-3=0.48 mm, La-3=Lb-3=2.70 mm, Za-3≈Zb-3≈35.6Ω
Wa-4=Wb-4=0.70 mm, La-4=Lb-4=2.60 mm, Za-4≈Zb-4≈30Ω)
Wa-5=Wb-5=1.06 mm, La-5=Lb-5=2.45 mm, Za-5≈Zb-5≈22Ω
Ws=0.25 mm, Ls=2.53 mm, Zs≈51Ω,
and the system impedance is ≈50Ω. Moreover, the dielectric substrate 19 is Aluminate (AlO2), with a dielectric constant of 9.6. The height of the dielectric substrate (h1 in FIG. 2) is 0.254 mm. The thickness of each of the microstrip lines and the shunt are 5 micrometer and the material is Gold (Au). This gives a center frequency of about 10 GHz and an impedance ratio of 2.2:1.

In order to achieve steeper slopes at the band edges several filter units may be cascaded. Hence, according to aspects the claimed subject matter comprises a bandpass filter 50 comprising at least two filter units 40, as previously discussed in relation to FIGS. 5-6, connected in series. In other words, it is provided a filter arrangement comprising cascade coupled T-shaped filters. By varying the number of cascade coupled T-shaped filters, the slopes of the band edges may be adjusted.

Moreover, by utilizing such design, a bandpass filter with a bandwidth of at least 160% can be achieved, independently of the chosen center frequency. Moreover, it is provided for a filter with a flat bandpass region. Hence, the flexibility is vast in terms of design possibilities and applications.

According to some aspects, the filter units comprised in a bandpass filter is built up from a particular filter unit.

According to other aspects, the filter units comprised in a bandpass filter is designed to have the same center frequency but the filter units comprise different amounts of transmission lines 23-1, . . . , 23-n, 24-1, . . . , 24-m.

According to further aspects, the filter units comprised in a bandpass filter differs both in the number of comprised transmission lines, as well as in their center frequency.

According to even further aspects the bandpass filter 50 comprises at least five filter units 40 connected in series. Hence, five filter units as described in reference to FIGS. 5-6 are cascade coupled.

Figure 9B:
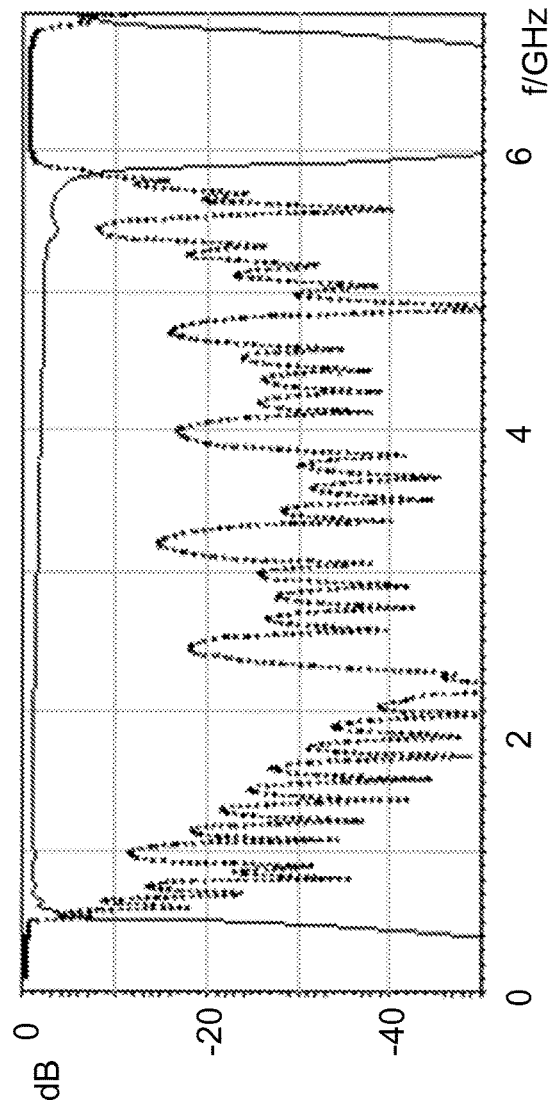
FIG. 9b shows a signal transmission (solid) and an input port match (dashed) of a bandpass filter as illustrated in FIG. 9a when the center frequency is 3.3 GHz.
Figure 9C:
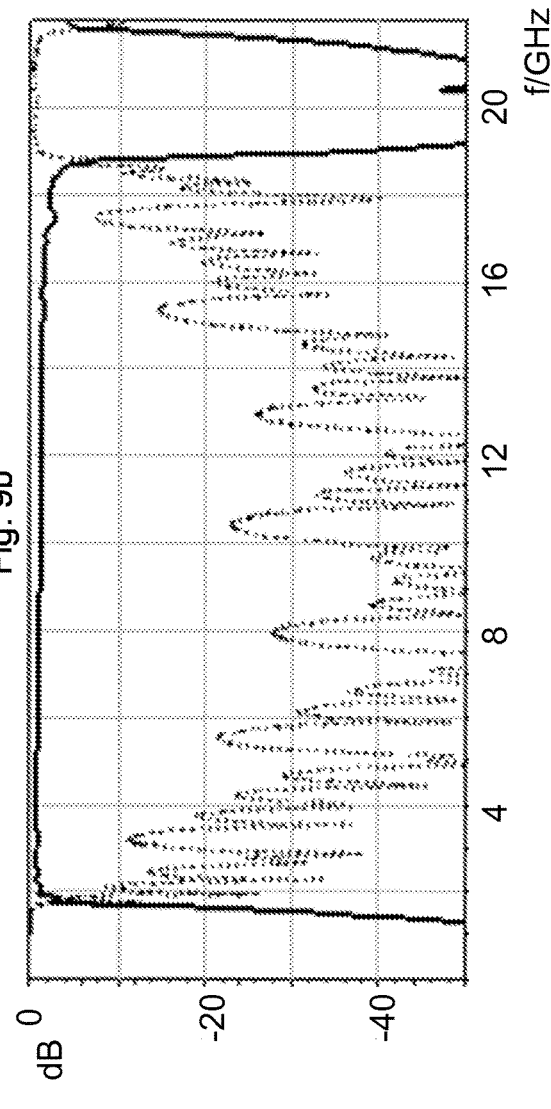
FIG. 9c shows a signal transmission (solid) and an input port match (dashed) of a bandpass filter as illustrated in FIG. 9a when the center frequency is 10 GHz.
Figure 9A:
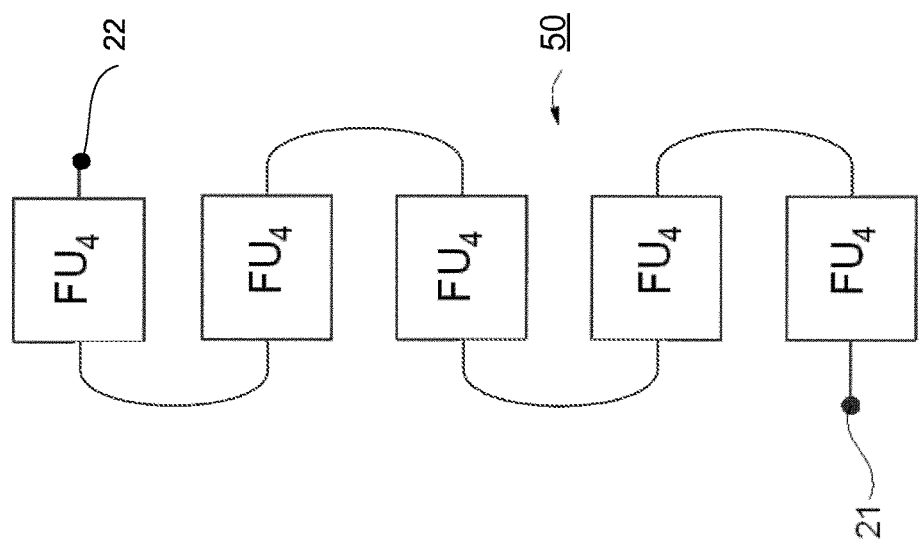
FIG. 9a shows a bandpass filter according to one aspect of the disclosure. The bandpass filter comprises five filter units.

FIG. 9a illustrates an embodiment of a bandpass filter where five filter units 40 are connected in series. Moreover, the first segment 33 and the second segment 34 within each filter unit 40, FU4 comprises four transmission lines. Hence, five filter units as described with reference to FIGS. 7a and 7b are cascaded.

The number of impedances, i.e. transmission lines, in each side (segment) of the stepped impedance arrangement will determine the bandwidth of the bandpass filter (e.g. four stepped impedances in each side will result in bandpass filter having a bandwidth of larger than 160% of center frequency). A more narrow bandpass filter will be obtained if fewer impedances are used and an even broader bandpass filter will be achieve if more impedances are used.

Moreover, the proposed design provides for a bandpass filter with a flat bandpass region. Furthermore, very sharp and well defined fall-offs at the cut-off frequencies are achieved. Hence, the filter singles out the preferred frequency parts of a signal in efficient manner.

FIGS. 9b and 9c show simulations of specific implementations of a bandpass filter as shown in FIG. 9a. In FIGS. 9b and 9c the following general relationships is applied to the filter units in order to achieve a bandpass filter which satisfies the requirement of a bandwidth larger than 160%;
50 Ohm>(Za-1=Zb-1)>(Za-2=Zb-2)>(Za-3=Zb-3)>(Za-4=Zb-4) and Zs≈Za-1.

According to aspects, the inventive concept uses a planar design, microstrip pattern, with an impedance ratio 3:1.

An electromagnetic simulation of S-parameters (dB) is visualized in a low-frequency version with center frequency, fc=3.3 GHz, in FIG. 9b. The solid line represents the signal transmission (S21) and the dashed line represents the input port match (S11), respectively. The x-axis represents the frequency (GHz). Note the transmission gap at 6-7 GHz, where the signal is blocked.

An electromagnetic simulation of S-parameters (dB) is visualized in a high-frequency version with center frequency, fc=10 GHz, in FIG. 9c. The material properties and the geometrical values are the same as the once discussed in reference to FIG. 7b. Moreover, the solid line represents the signal transmission (S21) and the dashed line represents the input port match (S11), respectively. The x-axis represents the frequency (GHz). Note the transmission gap at 19-22 GHz, where the signal is blocked.

The solid graphs in FIGS. 9b and 9c show that the bandwidth is greater than 160%, independent of the center frequency. Alternatively, the filter satisfies a low loss character between 0.5-6 GHz and 2-18 GHz, respectively. It further satisfies fall-off with sharp slopes below 0.5 GHz and above 5.8 GHz (for fC=3.3 GHz) and below 2 GHz and above 18 GHz (for fC=10 GHz).

Comparing the signal transmissions in FIGS. 9b and 9c with the one in FIG. 7b show that by varying the number of cascade coupled filter units it is providing for an adjustment of the inclination of the slopes at the lower and upper cut-off frequencies. Hence, further flexibility is given in the design process.

Measurements are presented for the bandpass filter discussed in reference to FIG. 9c. In the measurements the filter was equipped with 150 µm Ground-Signal-Ground, GSG-probe pattern at input and output RF-ports and bended to fit into available thin film area.

Figure 9D:
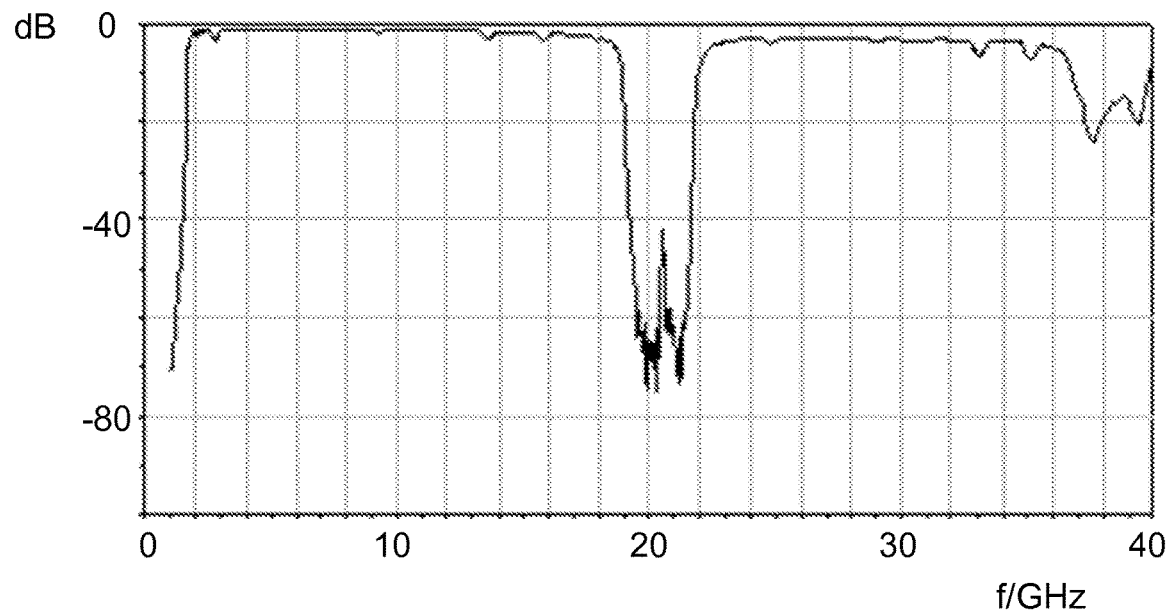
FIG. 9d shows a measured signal transmission for a bandpass filter as illustrated in FIG. 9a when the center frequency is 10 GHz.

A measured signal transmission (S21) is shown in dB for the frequency range 1 to 40 GHz in FIG. 9d. Note the transmission gap at 19 to 22 GHz, where the signal is stopped. Moreover, it is also visualized a how the filter link repeats itself. In order to achieve a high performance bandpass filter it is suggested that a low pass filter is connected in series with the discussed bandpass filter. The low pass filter may for example be designed to block, i.e. stop all signals above the higher cut-off value of the bandpass filter. Referring to FIG. 9d, it would be wise to use a low pass filter with a cut-off at approximately 20 GHz, which removes the higher bandpass with center frequency 3fC.

Figure 9E:
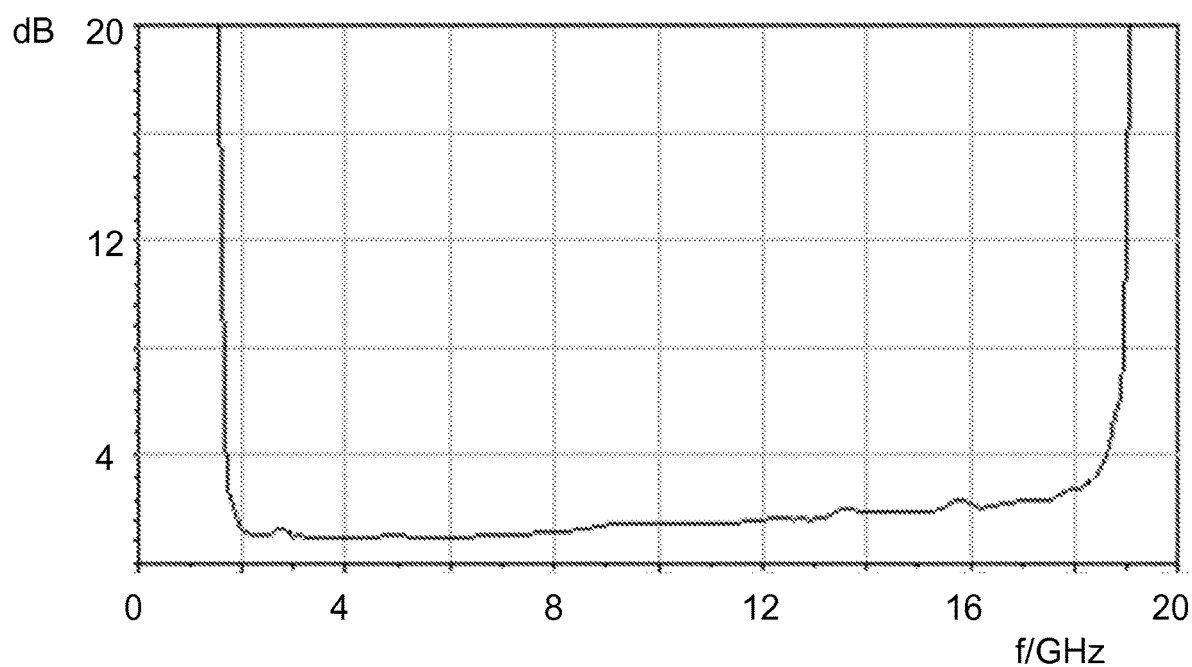
FIG. 9e shows a noise figure corresponding to the measurement in FIG. 9d.

FIG. 9e shows an associated measured Noise Figure in dB, taken from the character of FIG. 9d, in the frequency range 2-18 GHz. Noise figure in dB is expressed in terms of the S-parameters as;

$$NoiseFigure = 10\log\frac{1-|S_{22}|^2}{|S_{21}|^2}.$$

Another alternative embodiment of the bandpass filter 50 is given where at least four filter units 40, as previously described in relation to FIGS. 5-6, are connected in series.

According to aspects, the bandpass filter is designed such that the first segment 33 and the second segment 34 within each filter unit 40, FU5 comprises five transmission lines 23-1, . . . , 23-5, 24-1, . . . , 24-5. Hence, four filter units as described with reference to FIG. 8 are cascaded as figuratively illustrated in FIG. 10a.

Figure 10B:
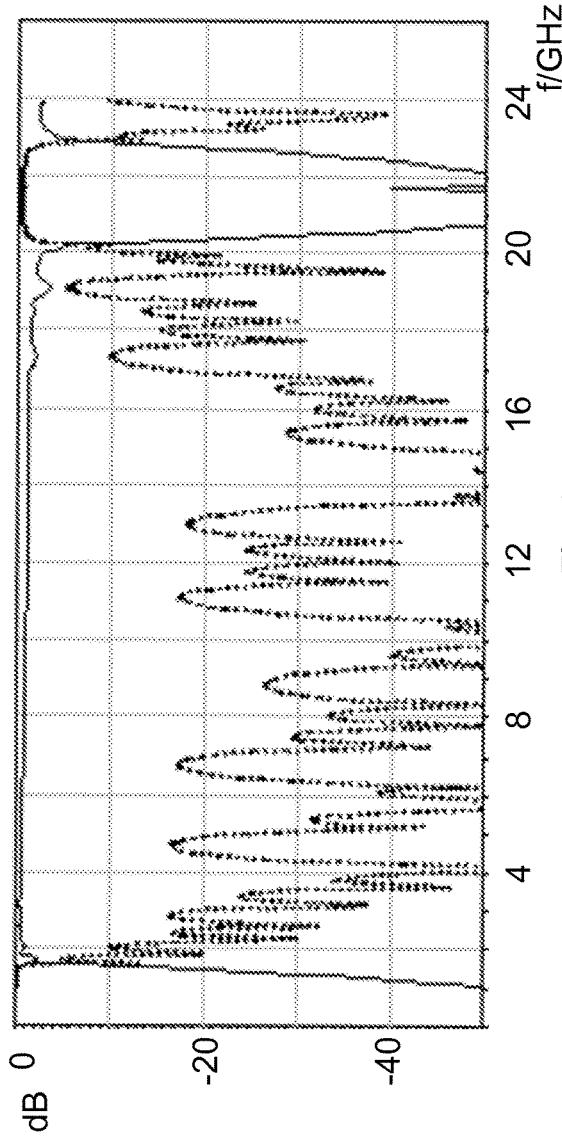
FIG. 10b shows a signal transmission (solid) and an input port match (dashed) of a bandpass filter as illustrated in FIG. 10a when the center frequency is 11 GHz.
Figure 10C:
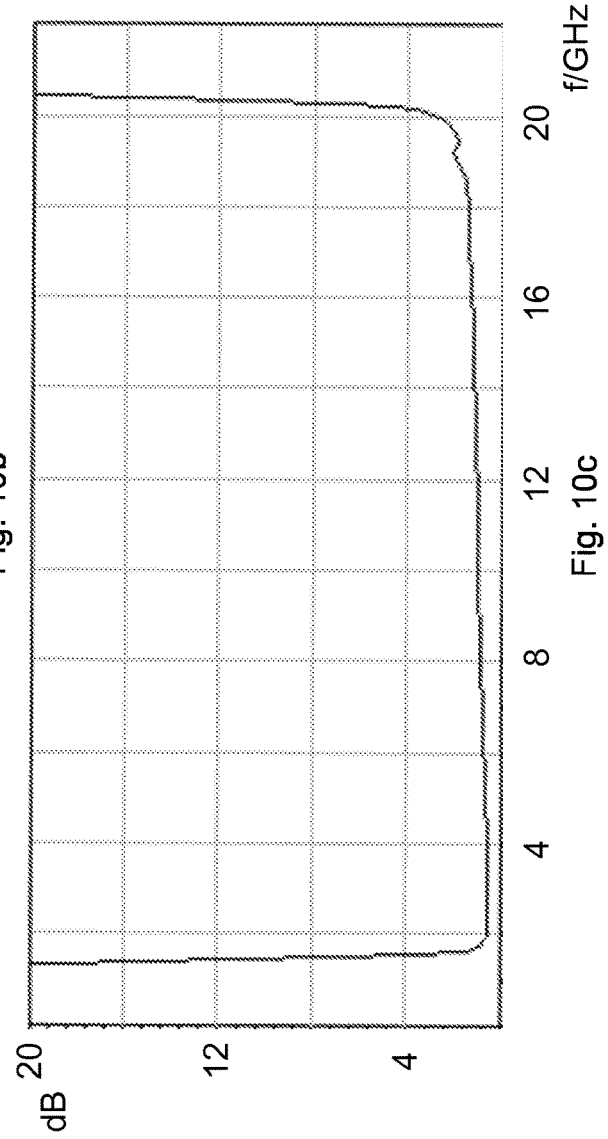
FIG. 10c shows a noise figure corresponding to the simulations in FIG. 10b.
Figure 10A:
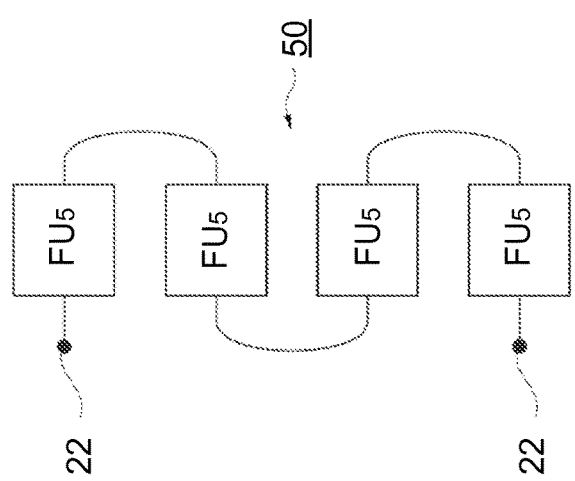
FIG. 10a shows a bandpass filter according to one aspect of the disclosure. The bandpass filter comprises four filter units.

FIG. 10b shows an electromagnetic simulation of S-parameters (dB) when the filter is designed as in FIG. 10a. The solid line represents the signal transmission (S21) and the dashed line represents the input port match (S11). This is a high-frequency version with center frequency, fc=11 GHz. The x-axis represents the frequency (GHz). Note the transmission gap between 20-23 GHz, before the filter repeats itself.

FIG. 10c shows an associated measured Noise Figure in dB, taken from the character of FIG. 10b, in the frequency range 2-20 GHz.

The relation between the number of transmission lines in each segment and the bandwidth can be seen by comparing FIG. 9c where four transmission lines are cascaded in each segment to FIG. 10b where five transmission lines are cascaded in each segment. As previously stated the more transmission lines the broader bandwidth.

The provided bandpass filter enables the filter designer to achieve a high performance ultra-wideband filter with a bandwidth of above 160% independently of the center frequency. The achieved filter has also steep fall-offs at the cut-off frequencies.

In several of the discussed embodiments the filter units have been realized as a microstrip designs. These designs can for example be manufactured by utilizing thin film printing technology. Moreover, according to some aspects it is advisable to utilize dielectric substrates with a high dielectric constant in order to keep the overall size of the filter manageable. According to further aspects the dielectric substrates may also be chosen from the Rogers family or other soft substrate materials.

Many of the discussed designs, embodiment and aspects thereof have been exemplified by utilizing microstrip designs. The disclosed filter unit and filter may equally well be designed utilizing other designs and techniques.

In one example, a stripline design (as discussed in relation to FIG. 3) is implemented. That is, in an exemplary design of the filter unit 40, a second dielectric substrate 29 has a first surface portion 27 and a second surface portion 28 with a second conducting plane 14 located thereon. Moreover, the first surface portion 27 of the second dielectric substrate 29 is in connection with the second surface portion 18 of the first dielectric substrate 19 and the at least one transmission arrangement 20. The transmission arrangement comprises the same features as discussed in relation to FIGS. 5-8. A stripline design can of course also be used when cascading filter units in order to for a bandpass filter as discussed in reference to FIGS. 9-10, or other bandpass filters comprising unit filters discussed in relation to FIGS. 5-8. According to some aspects it is common to choose h1=h2, but an asymmetrical solution is also possible.

Figure 11:
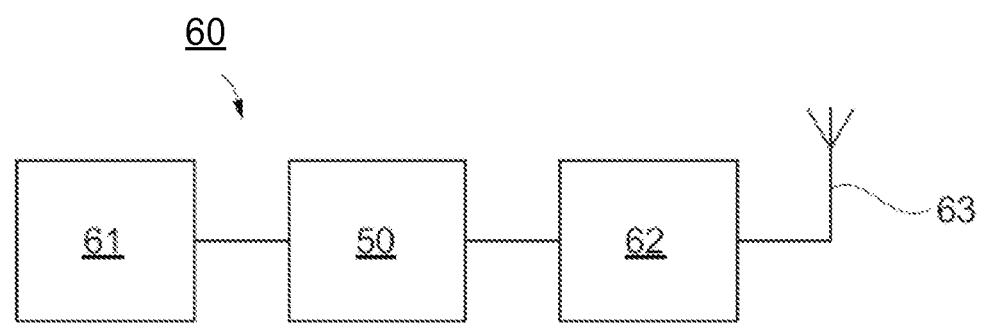
FIG. 11 is a system for detection according to aspects of the disclosure.

It is further provided a system 60 for detection, figuratively shown in FIG. 11. The system comprises detection circuitry 61, at least one bandpass filter 50, and at least one sensor 62 comprising an antenna 63, wherein the at least one bandpass filter 50 is configured according to what have been mentioned in reference to FIGS. 5-10. In other words, it is provided a broadband system, i.e. a system that can listen and detect signals in a large frequency window.

The same advantages and benefits are obtained for the detection system as for the filter unit and bandpass filter as such.

All fixed values, e.g. the setting of the system impedance to 50 Ohm, are of course to be seen in the light of a tolerance level acceptable within the technical field. Hence, a deviation of a couple of percentage from the set value is not to be seen as not comprised in the claimed subject matter.

The given examples have been focusing on the frequency range of GHz. This should be seen as examples of the performance of the filter unit and the corresponding bandpass filter. Hence, it should not be seen as a restriction. The filter design works perfectly well even at other frequencies.

However, when implemented for low frequencies, the design requires a larger surface.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims. Thus, the disclosure should be regarded as illustrative rather than restrictive, and not as being limited to the particular aspects discussed above.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled person in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed. It should further be noted that any reference signs do not limit the scope of the claims.

The invention claimed is:

1. A filter unit with a center frequency, comprising:
   a first dielectric substrate having a first surface portion and a second surface portion; a first conducting plane located on the first surface portion; and at least one transmission arrangement located on the second surface portion, wherein the at least one transmission arrangement comprises:
      a shunt node having a shunt connection to the conducting plane, wherein an electrical length of the shunt connection defines the center frequency of the filter unit and
      a plurality of transmission lines connected in series between an input port and an output port, said input port and said output port connectable to a respective auxiliary system each with a system impedance; wherein each transmission line has a characteristic impedance;
   and wherein the characteristic impedance of each transmission line is less than the system impedance, and wherein the plurality of transmission lines are symmetrical about the shunt node with regard to at least the characteristic impedances of the plurality of transmission lines, and wherein the shunt node is a single shunt node.

2. The filter unit according to claim 1,
   wherein the shunt connection has said electrical length;
   wherein the center frequency of the filter unit is related to a wavelength of the filter unit;
   and wherein the electrical length of the shunt connection is $2\pi Ls/\lambda c = \pi/2 + p2\pi$, wherein p is an integer greater or equal to zero.

3. The filter unit according to claim 1, wherein the plurality of transmission lines is divided into a first segment and a second segment, wherein the first segment is connected between the input port and the shunt node, and wherein the second segment is connected between the output port and the shunt node, and wherein each segment have a first transmission line and a second transmission line, and wherein the characteristic impedance of the first transmission line of the plurality of transmission lines is greater than the characteristic impedance of the second transmission line of the plurality of transmission lines.

4. The filter unit according to claim 3, wherein the second transmission line is arranged closer to the shunt node than the first transmission line.

5. The filter unit according to claim 1, wherein the shunt connection has a characteristic impedance and wherein a ratio between the characteristic impedance of the shunt connection and the system impedance is in the interval 0.8-1.2, and preferable in the interval 0.9-1.1.

6. The filter unit according to claim 1, wherein a ratio between the characteristic impedance of the transmission line connected to the first port and the system impedance is more than 0.8 or wherein a ratio between the characteristic impedance of the transmission line connected to the second port and the system impedance is more than 0.8.

7. The filter unit according to claim 3, wherein the first segment and the second segment comprise equal amounts of transmission lines connected in series.

8. The filter unit according to claim 1, wherein the system impedance is 50 Ohm.

9. The filter unit according to claim 3, wherein the first segment and the second segment each comprise at least four transmission lines connected in series.

10. The filter unit according to claim 3, wherein the first segment and the second segment each comprise at least six transmission lines connected in series.

11. The filter unit according to claim 1, wherein a second dielectric substrate having a first surface portion and a second surface portion with a second conducting plane located thereon, wherein the first surface portion of the second dielectric substrate is in connection with the second surface portion of the first dielectric substrate and the at least one transmission arrangement.

12. The filter unit according to claim 1, wherein each transmission line has an electrical length; and
   wherein the electrical length of the transmission lines and the electrical length of the shunt connection corresponds to an equivalent electrical length in the interval 0.2n;
   and wherein a ratio between the equivalent electrical length of each transmission line and the equivalent electrical length of the shunt connection is in the interval 0.9-1.1 at the center frequency of the filter unit.

13. The filter unit according to claim 12, wherein the ratio is in the interval if 0.99-1.01.

14. The filter unit according to claim 1, wherein the at least one transmission arrangement is a stepped impedance arrangement.

15. A bandpass filter comprising at least two filter units, according to claim 1, connected in series.

16. The bandpass filter according to claim 15, wherein at least five filter units are connected in series.

17. The bandpass filter according to claim 16, wherein the first segment and the second segment within each filter unit comprises four transmission lines.

18. The bandpass filter according to claim 15, wherein at least four filter units are connected in series.

19. The bandpass filter according to claim 18, wherein the first segment and the second segment within each filter unit comprises five transmission lines.

20. A system for detection comprising detection circuitry, at least one bandpass filter, and at least one sensor comprising an antenna, wherein the at least one bandpass filter is configured according to claim 15.

\* \* \* \* \*